(12) United States Patent
Kim et al.

(10) Patent No.: US 8,703,394 B2
(45) Date of Patent: Apr. 22, 2014

(54) METHOD FOR FORMING THIN FILM PATTERN AND FLAT DISPLAY DEVICE HAVING THE SAME

(75) Inventors: Jeong-Oh Kim, Seoul (KR); Jung-Il Lee, Goyang-si (KR); Kang-Il Kim, Seoul (KR); Jung-Ho Bang, Paju-si (KR); Jung-Sun Beak, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 230 days.

(21) Appl. No.: 13/157,363

(22) Filed: Jun. 10, 2011

(65) Prior Publication Data

US 2011/0305882 A1    Dec. 15, 2011

(30) Foreign Application Priority Data

Jun. 11, 2010 (KR) .................. 10-2010-0055335

(51) Int. Cl.
*G03F 7/26* (2006.01)

(52) U.S. Cl.
USPC ............................ 430/314; 430/328; 430/394

(58) Field of Classification Search
USPC .......................... 430/312, 313, 394, 314, 328
See application file for complete search history.

(56) References Cited

U.S. PATENT DOCUMENTS

| 4,807,015 | A  | * | 2/1989  | Kobayashi et al. | ........... 257/770 |
| 6,893,972 | B2 |   | 5/2005  | Rottstegge et al. | |
| 7,253,113 | B2 |   | 8/2007  | Cheng | |
| 2003/0215749 | A1 | * | 11/2003 | Kato et al. | ........... 430/296 |
| 2008/0305642 | A1 | * | 12/2008 | Lee et al. | ........... 438/703 |

FOREIGN PATENT DOCUMENTS

| CN | 1973358 | 5/2007 |
| KR | 10-0871967 B1 | 8/2008 |

* cited by examiner

*Primary Examiner* — Gerard T. Higgins
*Assistant Examiner* — Caleen Sullivan
(74) *Attorney, Agent, or Firm* — McKenna Long & Aldridge LLP

(57) ABSTRACT

The present disclosure is a method for forming a thin film pattern to form a micron-pattern and a flat display device having the same. The method for forming a thin film pattern includes the steps of forming first to third thin film layers on a substrate in succession, forming a first photoresist pattern on the third thin film layer, patterning the second and third thin film layers using the first photoresist pattern as a mask to form first and second thin film mask pattern having line widths different from each other, forming a second photoresist pattern at a region where the first and second thin film mask patterns do not overlap positioned between the first thin film layer and the second thin film mask pattern, removing the first and second thin film mask patterns, and patterning the first thin film layer using the second photoresist pattern as a mask.

4 Claims, 9 Drawing Sheets

US 8,703,394 B2

METHOD FOR FORMING THIN FILM PATTERN AND FLAT DISPLAY DEVICE HAVING THE SAME

CROSS REFERENCE TO RELATED APPLICATION

This application claims the benefit of the Patent Korean Application No. 10-2010-0055335, filed on Jun. 11, 2010, which is hereby incorporated by reference as if fully set forth herein.

BACKGROUND OF THE DISCLOSURE

1. Field of the Disclosure

The present disclosure relates to a method for forming a thin film pattern to form a micron-pattern and a flat display device having the same.

2. Discussion of the Related Art

Recently, the display device market is rapidly changing centered on the flat display devices which are becoming easier to fabricate lighter and larger sized display devices. Flat display devices include liquid crystal display devices (LCD), plasma display panels (PDP), organic electro luminescence display devices (OLED), and so on.

A plurality of thin film patterns in the flat display device are formed through a thin film deposition step, a photolithography step having an exposure and development step, and a mask step having an etching step and a photoresist removing step.

A photoresist pattern formed in the photolithography step has a minimum line width of about 4 μm, and about 3 μm of a minimum distance between the photoresist patterns. The thin film pattern formed by etching using the photoresist pattern has a minimum line width of about 3 μm, and about 4 μm of a minimum distance between the thin film patterns. Therefore, the resolution of forming the thin film pattern for a below the minimum line width of the thin film pattern is difficult.

SUMMARY OF THE DISCLOSURE

Accordingly, the present disclosure is directed to a method for forming a thin film pattern and a flat display device having the same.

An object of the present disclosure is to provide a method for forming a thin film pattern which enables to form a micron-pattern and a flat display device having the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a method for forming a thin film pattern includes the steps of forming first to third thin film layers on a substrate in succession, forming a first photoresist pattern on the third thin film layer, patterning the second and third thin film layers by using the first photoresist pattern as a mask to form first and second thin film mask patterns having line widths different from each other, forming a second photoresist pattern at a region positioned between the first thin film layer and the second thin film mask pattern where the first and second thin film mask patterns do not overlap with each other, removing the first and second thin film mask patterns, and patterning the first thin film layer by using the second photoresist pattern as a mask, to form a thin film pattern.

In this instance, the second thin film layer is formed of an inorganic insulating film or a columnar crystal group material, and the third thin film layer is formed of a non-transparent material which shields a light.

In detail, the columnar crystal group material is molybdenum.

In the meantime, the first thin film mask pattern has an obtuse or rectangular taper angle.

And, the step of forming a second photoresist pattern includes the steps of forming second photoresist pattern on the substrate having the first and second thin film mask pattern formed thereon to cover a side of the first thin film mask pattern and the first thin film layer, and exposing and developing the first photoresist pattern and the second photoresist pattern to remove the first photoresist pattern and to form the second photoresist pattern.

In another aspect of the present disclosure, a flat display device includes a plurality of thin film patterns spaced away by a first distance from one another, each of the thin film patterns including two thin film patterns, wherein the two thin film patterns have line widths formed the same with each other and spaced away by a second distance from each other.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present disclosure, examples of which are illustrated in the accompanying drawings. Wherever possible, the same reference numbers will be used throughout the drawings to refer to the same or like parts.

FIGS. 1A to 1G illustrate sections showing the steps of a method for forming a thin film pattern in accordance with an exemplary embodiment of the present disclosure.

Figure 1A:
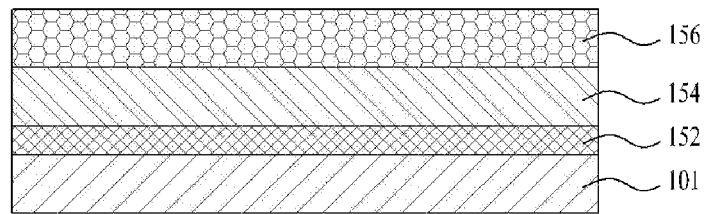
FIGS. 1A to 1G illustrate sections showing the steps of a method for forming a thin film pattern in accordance with an exemplary embodiment of the present disclosure.

Referring to FIG. 1A, first to third thin film layers 152, 154, and 156 are stacked on a substrate 101, in succession.

The first thin film layer 152, a material layer of the thin film pattern to be formed on the substrate 101, may be formed of a metal, an insulating film, or a semiconductor layer.

The second thin film layer 154 may be formed of a material which forms an obtuse or rectangular taper angle θ after etching process. In detail, the second thin film layer 154 may be formed of an inorganic insulating film, such as SiNx or SiOx, or a columnar crystal group metal, such as molybdenum.

The third thin film layer 156 may be formed of a non-transparent material, for an example, nickel Ni, which shields a light incident on photoresist at the time of exposure.

Figure 1B:
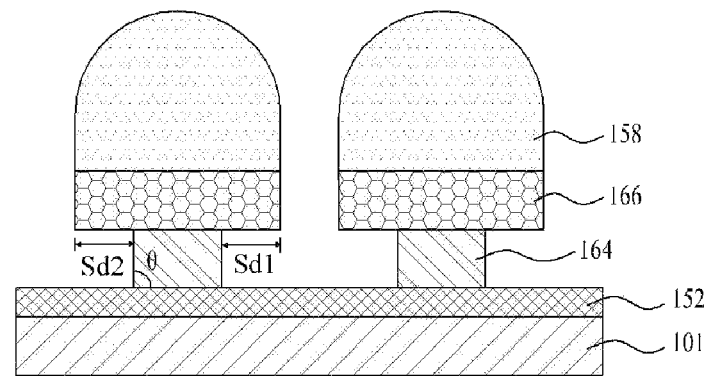

Then, referring to FIG. 1B, after coating a first photoresist on the third thin film layer 156, a first photoresist pattern 158 may be formed by exposure and development. After etching the third thin film layer 156 by using the first photoresist pattern 158 as a mask, the second thin film layer 154 may be etched, to form first and second thin film mask patterns 164 and 166. The first thin film mask pattern 164 may be formed to have a line width smaller than a line width of the second thin film mask pattern 166. A distance Sd1 between one side of the first thin film mask pattern 164 and one side of the second thin film mask pattern 166 may be the same with a distance Sd2 between the other side of the first thin film mask pattern 164 and the other side of the second thin film mask pattern 166. In this instance, depending on an extent of etching of the second thin film layer, the distance Sd1 between one side of the first thin film mask pattern 164 and one side of the second thin film mask pattern 166 and the distance Sd2 between the other side of the first thin film mask pattern 164 and the other side of the second thin film mask pattern 166 vary. That is, an etching time period on the second thin film layer may be relatively prolonged or shortened, an etching amount of the second thin film layer may increase or decease relatively, the distance Sd1 between one side of the first thin film mask pattern 164 and one side of the second thin film mask pattern 166 and the distance Sd2 between the other side of the first thin film mask pattern 164 and the other side of the second thin film mask pattern 166 become relatively longer or shorter.

In the meantime, the distance Sd1 between one side of the first thin film mask pattern 164 and one side of the second thin film mask pattern 166 and the distance Sd2 between the other side of the first thin film mask pattern 164 and the other side of the second thin film mask pattern 166 may vary a line width of the second photoresist pattern.

And, the taper angle θ of the first thin film mask pattern 164 may be formed to be an obtuse angle or a right-angle. In detail, at the time of etching the second thin film layer of inorganic insulating film, if a content of an etch gas of $SF_6$ is increased greater than a content (about 1500 sccm) of the etch gas of $SF_6$ at which the taper angle of the second thin film layer may be formed to be an acute angle, the taper angle θ of the first thin film layer is formed to be an obtuse angle or a right angle. If the second thin film layer 154 of the columnar crystal group material which has an excellent traveling straight characteristic is etched, the taper angle θ of the first thin film mask pattern 164 may become a right angle.

Figure 1C:
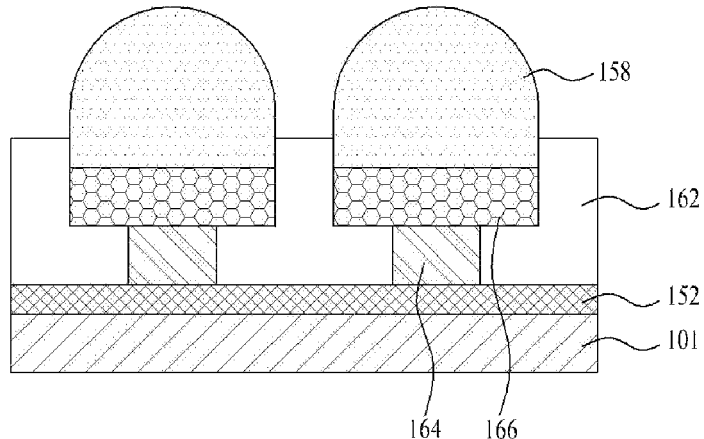

Then, referring to FIG. 1C, second photoresist 162 may be coated between the first and second thin film mask patterns 164 and 166. In this instance, since the second photoresist 162 is coated on the substrate 101 in a liquid state, the second photoresist 162 may also be coated on a side of the first thin film mask pattern 164 which has an inverted step from the second thin film mask pattern 166. That is, the second photoresist 162 may be formed to cover the sides of the first thin film mask pattern 164 and the first thin film layer 152 exposed between the first thin film mask patterns 164. In this instance, a minimum height of the second photoresist 162 may be the same with a height of the first thin film mask pattern 164.

Figure 1D:
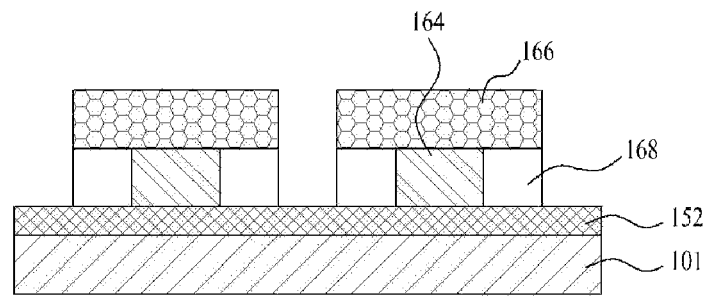

Then, referring to FIG. 1D, the first photoresist pattern 158 may be removed by full surface exposure and development, and, since the second thin film mask pattern 166 of a non-transparent material is used as a mask in exposure, the second photoresist 162 under the second thin film mask pattern 166 is patterned by exposure and development to form a second photoresist pattern 168. That is, the second photoresist pattern 168 may be formed at a region positioned between the first thin film layer 152 and the second thin film mask pattern 166 at which the first and second thin film mask patterns 164 and 166 do not overlap with each other. A sum of line widths of the second photoresist pattern 168 positioned on both sides of the first thin film mask pattern 164 and the first thin film mask pattern 164 becomes the same with a line width of the second photoresist pattern 168.

Figure 1E:
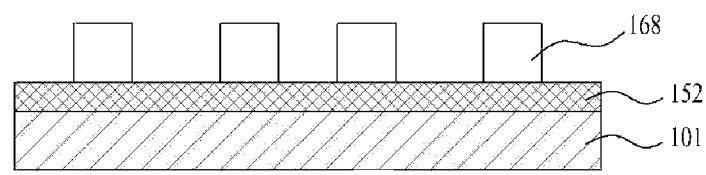

Then, referring to FIG. 1E, the second thin film mask pattern 166 and the first thin film mask pattern 164 may be etched and removed in succession to leave the second photoresist pattern 168 on the first thin film layer 152.

Figure 1F:
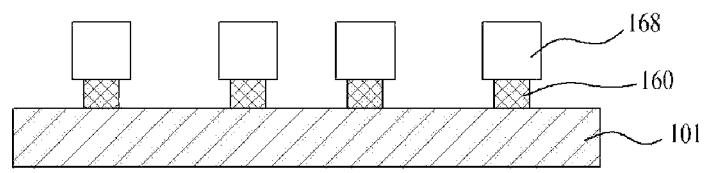
Figure 1G:
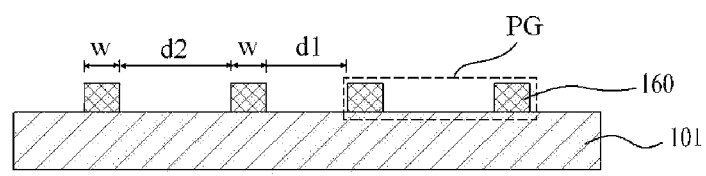

Then, referring to FIG. 1F, the first thin film layer 152 may be etched by using the second photoresist pattern 168 as a mask, to form a thin film pattern 160 on the substrate 101 as shown in FIG. 1G.

The thin film pattern 160 may form a thin film pattern group PG with an adjacent thin film pattern 160 formed from the first photoresist pattern 158 and the first and second thin film mask patterns 164 and 166. In this instance, the thin film pattern group PG may be spaced a first distance from an adjacent thin film pattern group PG, and the thin film patterns 160 in the thin film pattern group PG is spaced a second distance away from each other, and have the same line widths w. The thin film pattern 160 may have a line width of about 400~1000 nm.

Figure 2:
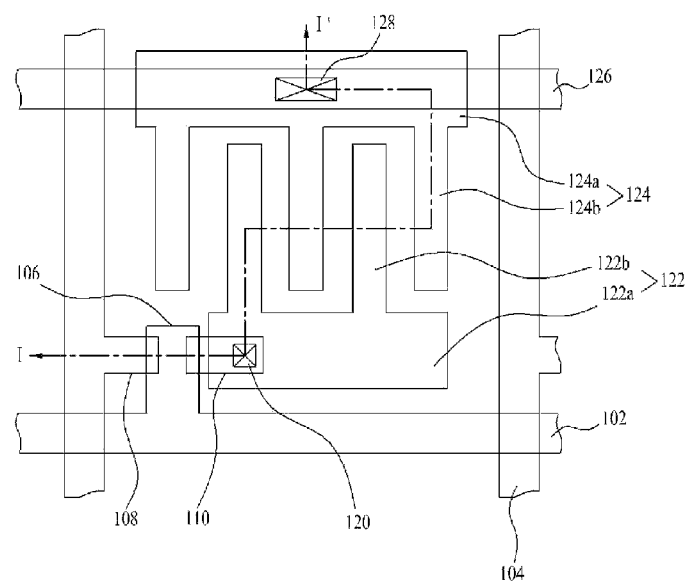
FIG. 2 illustrates a plan view of a thin film transistor substrate having a thin film pattern of an exemplary embodiment applied thereto.
Figure 3:
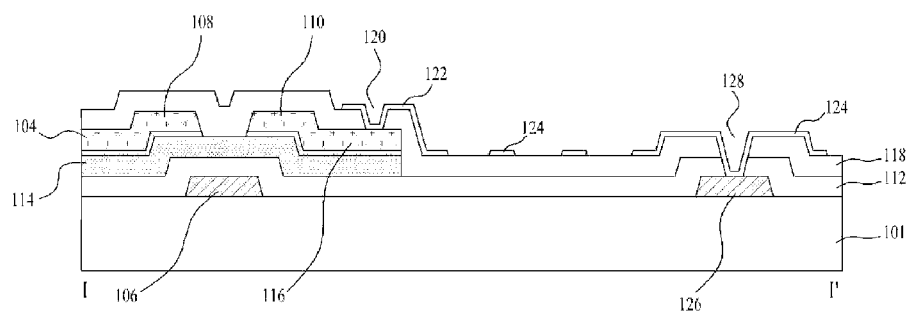
FIG. 3 illustrates a section of the thin film transistor substrate cut across the line I-I in FIG. 1.

The thin film pattern 160 can be applicable to a pixel electrode 122, a common electrode 124, a data line 104, a gate line 102, and a common line 126 shown in FIGS. 2 and 3. In one case, the thin film pattern 160 is applied to a signal line, like the data line 104, the gate line 102, and the common line 126, since the signal line has a line width reduced smaller than the related art, increasing a pixel region as much as the reduction of the line width, an aperture is increased.

FIGS. 2 and 3 illustrate a plan view and a sectional view of a thin film transistor substrate having a thin film pattern formed by a forming method shown in FIGS. 1A to 1G, respectively.

The thin film transistor substrate may include a thin film transistor connected to the gate line 102 and the data line 104, and a pixel electrode 122 formed at a pixel region provided at every crossed structure of the gate line 102 and the data line 104.

The thin film transistor causes a pixel signal supplied to the data line 104 in response to a scan signal supplied to the gate line 102 to be charged and maintained at the pixel electrode 122. To do this, the thin film transistor includes a gate electrode 106, a source electrode 108, a drain electrode 110, an active layer 114, and an ohmic contact layer 116.

The gate electrode 106 is connected to the gate line 102 such that the scan signal is supplied to the gate electrode 106 from the gate line 102. The source electrode 108 is connected to the data line 104 such that the pixel signal is supplied to the source electrode 108 from the data line 104. The drain electrode formed opposite to the source electrode 108 with a channel portion of the active layer 114 may be disposed there between for supplying the pixel signal from the data line 104 to the pixel electrode 122. The active layer 114 may be formed at the channel portion between the source and drain electrodes 108 and 110 overlapped with the gate electrode 106 with a gate insulating film 112 disposed there between. The ohmic contact layer 116 may be formed between the source electrode 108 and the active layer 114 and between the drain electrode 110 and the active layer 114, i.e., over the active layer 114 except the channel portion. The ohmic contact layer 116 serves to reduce electric contact resistance between the source electrode 108 and the active layer 114 and between the drain electrode 110 and the active layer 114.

The pixel electrode 122 may be connected to the drain electrode 110 through a pixel contact hole 120. According to this, the pixel electrode 122 may have the pixel signal supplied thereto from the data line 104 through the thin film transistor. The pixel electrode 122 has a pixel horizontal portion 122a parallel to the gate line 102, and a pixel vertical portion 122b extended vertically from the pixel horizontal portion 122a.

The common electrode 124 may have the common line 126 connected thereto for receiving a common voltage through the common line 126. The common electrode 124 may be formed of the same material and on the same plane with the pixel electrode 122 or different material and at different plane from the pixel electrode 122. The present disclosure will be described taking the common electrode 124 and the pixel electrode 122 formed at the same plane of a protective film 118 and the same material of a transparent conductive film as an example.

The common electrode 124 may include a common horizontal portion 124a parallel to the gate line 102, and a common vertical portion 124b extended in a vertical direction from the common horizontal portion 124a. In this instance, the vertical common portion 124b is formed parallel to the pixel vertical portion 122b. Accordingly, a horizontal electric field is formed between the pixel electrode 122 having a pixel voltage signal supplied thereto and the common electrode 124 having the common electrode supplied thereto. The horizontal electric field rotates the liquid crystal molecules arranged in a horizontal direction between the thin film transistor substrate and the color filter substrate (not shown) owing to dielectric anisotropy. And, since optical transmissivity through the sub-pixel regions varies with extents of rotation of the liquid crystal molecules, a picture can be produced.

Figure 4A:
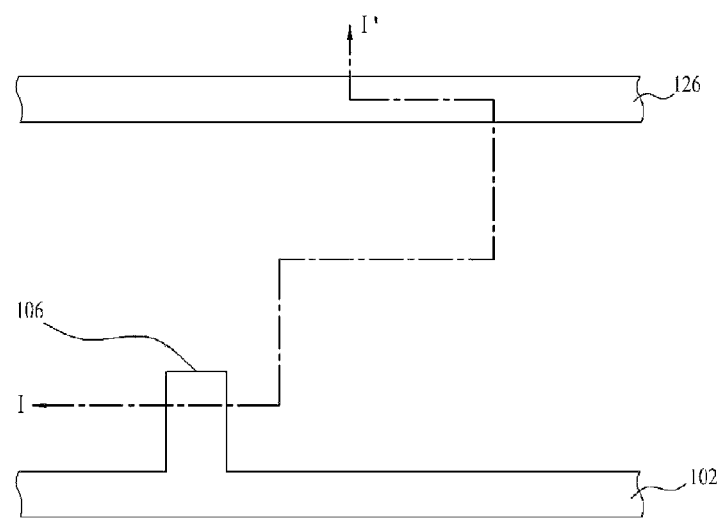
FIGS. 4A and 4B illustrate a plan view and a sectional view showing an exemplary method for forming the gate metal pattern shown in FIGS. 2 and 3.
Figure 4B:
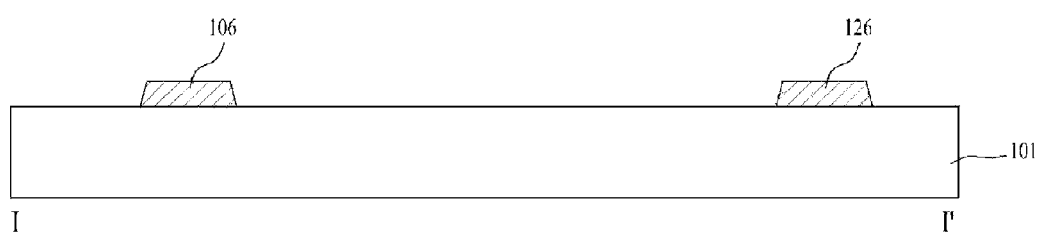

FIGS. 4A and 4B illustrate a plan view and a sectional view showing a method for forming the gate metal pattern shown in FIGS. 2 and 3 in the method for forming a thin film transistor substrate in accordance with an exemplary embodiment of the present disclosure.

A gate metal pattern having the common line 126 and the gate line 102 and the gate electrode 106 may be formed on a lower substrate 101. Formation of the gate metal pattern by a fabricating method shown in FIGS. 1A to 1G will be described taking FIGS. 5A to 5F as an example.

Figure 5A:
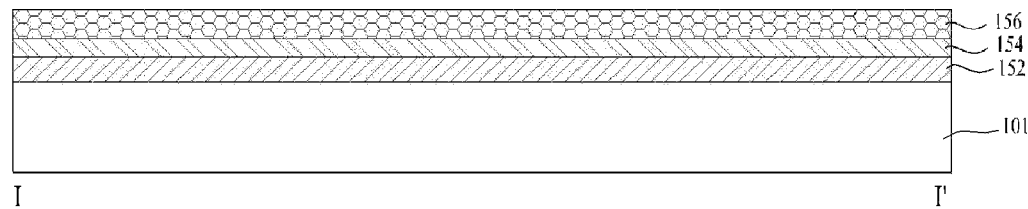
FIGS. 5A to 5F illustrate sections showing the steps of an exemplary method for forming the gate metal pattern shown in FIGS. 2 and 3, in detail.

In detail, referring to FIG. 5A, first to third thin film layers may be stacked on the lower substrate 101 in succession by deposition, such as sputtering. The first thin film layer may be a single layer of metal, such as Mo, Ti, Cu, AlNd, Al, Cr, an Mo alloy, an Al alloy, and so on, or a stack of two or more than two layers. The second thin film layer 154 may be formed of an inorganic insulating film, such as SiNx or SiOx, or a columnar crystal group metal, such as molybdenum. The third thin film layer 156 may be formed of a non-transparent material which can shield light.

Figure 5B:
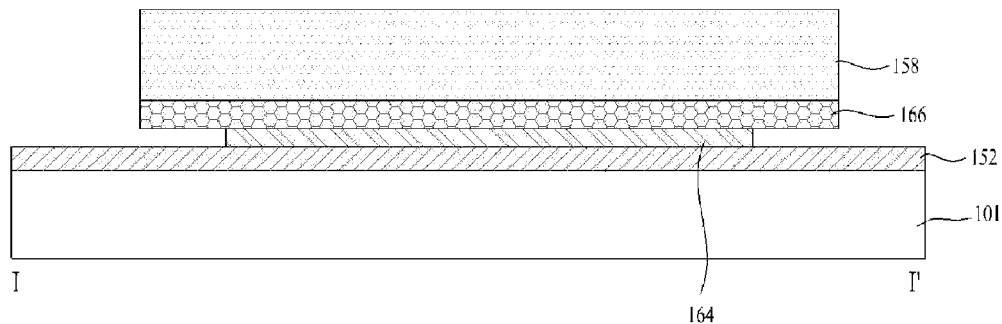
Figure 5C:
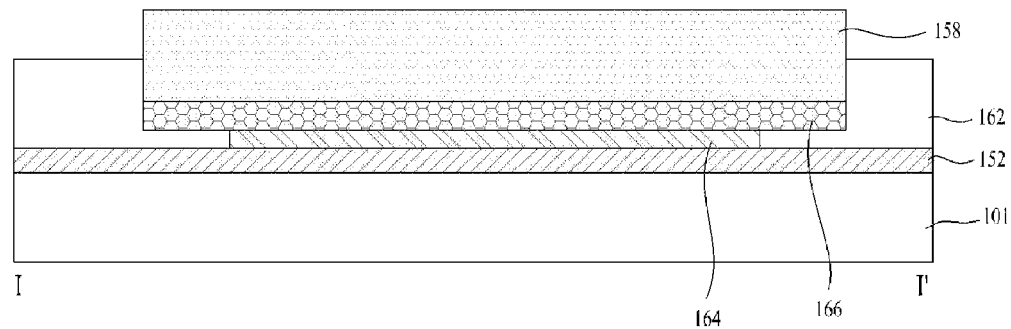
Figure 5D:
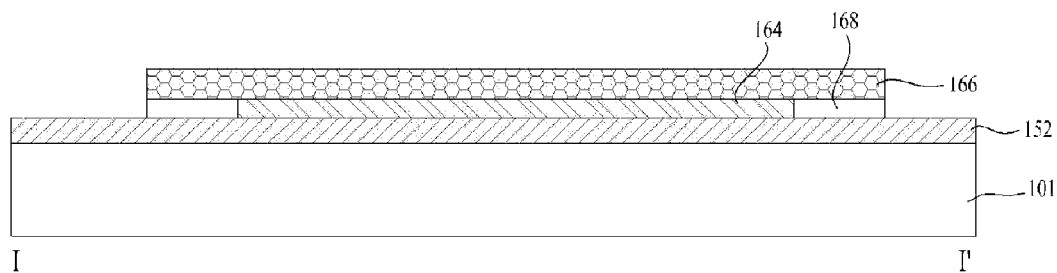

Then, referring to FIG. 5B, a first photoresist is coated on the third thin film layer 152, and subjected to exposure and development to form a first photoresist pattern 158. The second thin film layer 154 may be etched after etching the third thin film layer 156 by using the first photoresist pattern 158 as a mask to form first and second thin film mask patterns 164 and 166. Then, as shown in FIG. 5C, a second photoresist 162 may be coated between the first and second thin film mask patterns 164 and 166. Then, full surface exposure and development may be performed to remove the first photoresist pattern 158 as shown in FIG. 5D, and to pattern the second photoresist 162 under the second thin film mask pattern 166 to form a second photoresist pattern 168 since the second thin film mask pattern 166 is used as mask in the exposure and development. That is, the second photoresist pattern 168 may be formed at a region where the first and second thin film mask patterns 164 and 166 positioned between the first thin film layer 152 and the second thin film mask pattern 166 do not overlap with each other. A sum of line widths of the second photoresist pattern 168 and the first thin film mask pattern 164 positioned on opposite sides with the first thin film mask pattern 164 disposed there between may be the same with a line width of the second photoresist pattern 168.

Figure 5E:
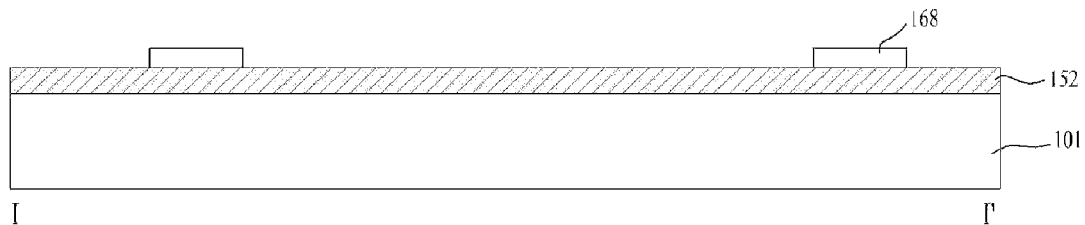
Figure 5F:

Then, referring to FIG. 5E, the second thin film mask pattern 166 and the first thin film mask pattern 164 may be removed by etching, to leave the second photoresist pattern 168 on the first thin film layer 152. As shown in FIG. 5F, the first thin film layer 152 may be etched by using the second photoresist pattern 168 as a mask, to form a gate metal pattern including the gate line 102 and the common line 126 on the substrate 101.

Figure 6A:
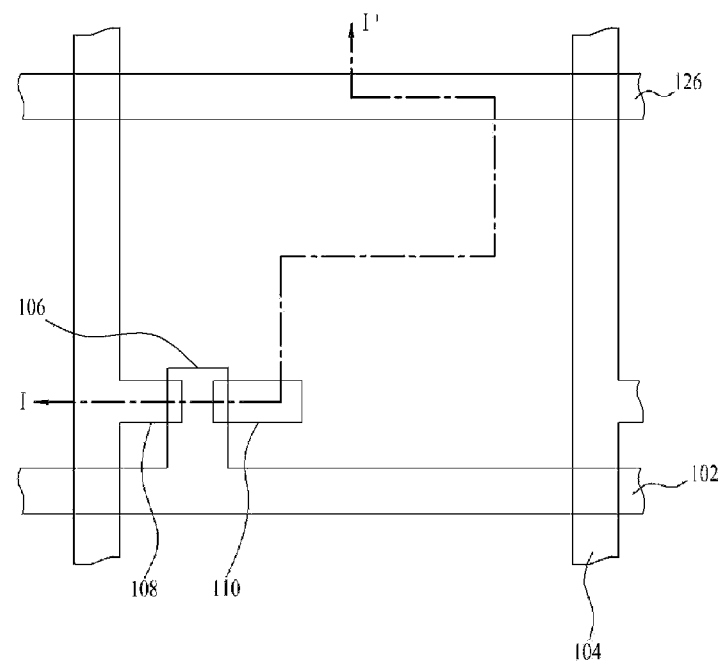
FIGS. 6A and 6B illustrate a plan view and a sectional view showing an exemplary method for forming the semiconductor pattern and the data metal pattern shown in FIGS. 2 and 3.
Figure 6B:
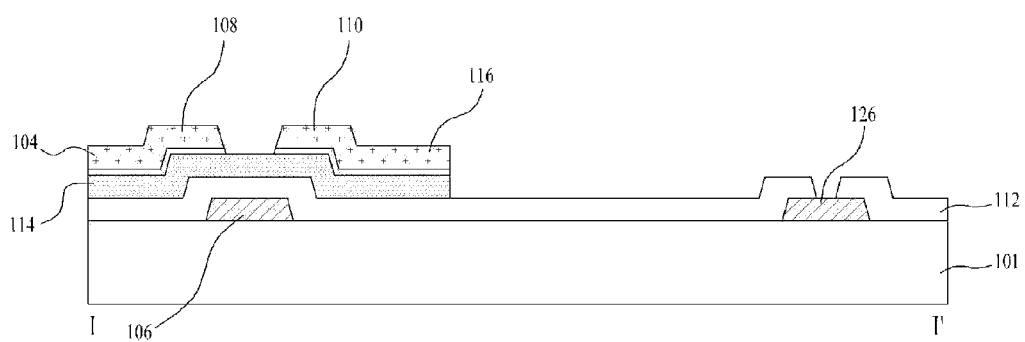

FIGS. 6A and 6B illustrate a plan view and a sectional view showing a method for forming the semiconductor pattern and the data metal pattern shown in FIGS. 2 and 3 in the method for forming a thin film transistor substrate in accordance with an exemplary embodiment of the present disclosure.

A gate insulating film 112 may be formed on the lower substrate 101 having the gate metal pattern formed thereon, a data metal pattern having a data line 104, a source electrode 108, and a drain electrode 110 may be formed on the gate insulating film 112, and a semiconductor pattern having an active layer 114 and an ohmic contact layer 116 is formed overlapped with, under and along, the data metal pattern. The semiconductor pattern and the data metal pattern may be formed by one mask process using a slit mask or a half tone mask.

In detail, the gate insulating film 112, an amorphous silicon layer, an impurity $n^+$ or $p^+$ doped amorphous silicon layer, and a data metal layer may be formed on the lower substrate 101 having the gate metal pattern formed thereon, in succession. And, after coating photoresist on the data metal layer, the photoresist is exposed and developed by photolithography with a slit mask to form a photoresist pattern having a step.

The data metal layer may be etched by using the photoresist pattern having the step to form the data metal pattern and the semiconductor pattern under the data metal pattern.

Then, the photoresist pattern is ashed with oxygen $O_2$ plasma. An exposed data metal pattern and the ohmic contact layer under the exposed data metal pattern are removed by etching by using the photoresist pattern ashed thus to separate the source electrode 108 from the drain electrode 110 and expose the active layer 114. Then, the photoresist pattern is removed from an upper side of the data metal pattern by stripping.

Figure 7A:
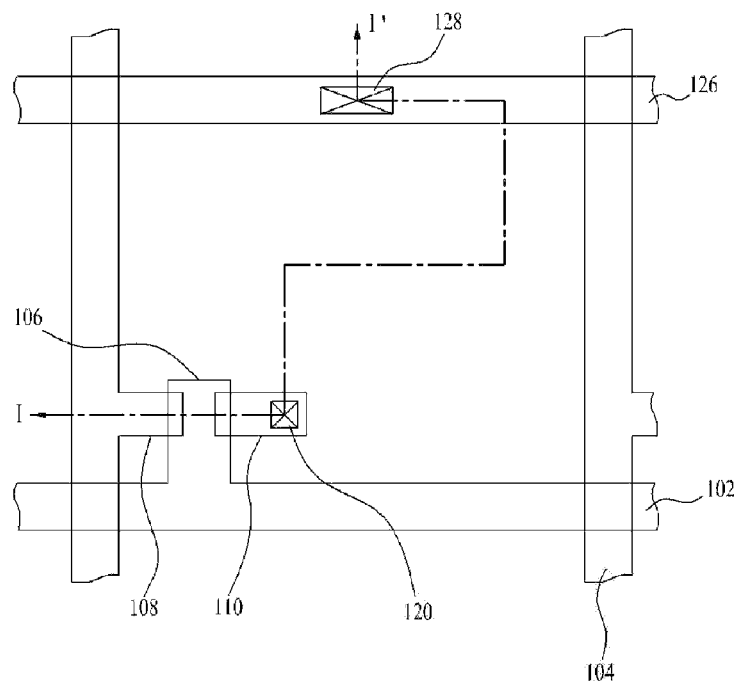
FIGS. 7A and 7B illustrate a plan view and a sectional view showing an exemplary method for forming the protective film having the pixel contact hole and the common contact hole shown in FIGS. 2 and 3.
Figure 7B:
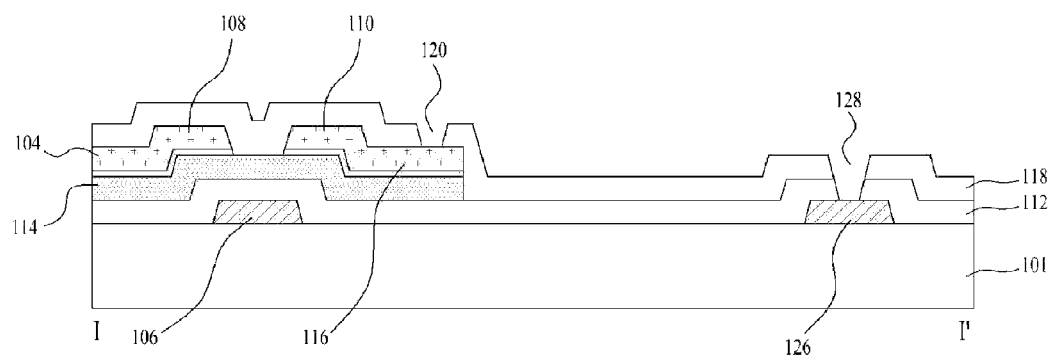

FIGS. 7A and 7B illustrate a plan view and a sectional view showing a method for forming the protective film having a pixel contact hole and a common contact hole in the method for forming a thin film transistor substrate in accordance with an exemplary embodiment of the present disclosure.

The protective film 118 having the pixel contact hole 120 and the common contact hole 128 may be formed on the substrate having the data metal pattern and the semiconductor pattern formed thereon. In detail, the protective film 118 is deposited by CVD or PECVD on the gate insulating film 112 having the data metal pattern formed thereon. The protective film 118 may be formed of an inorganic insulating material the same with the gate insulating film formed by CVD or PECVD.

Then, the protective film 118 may be patterned by photolithography and etching to form the pixel contact hole 120 and the common contact hole 128.

Figure 8A:
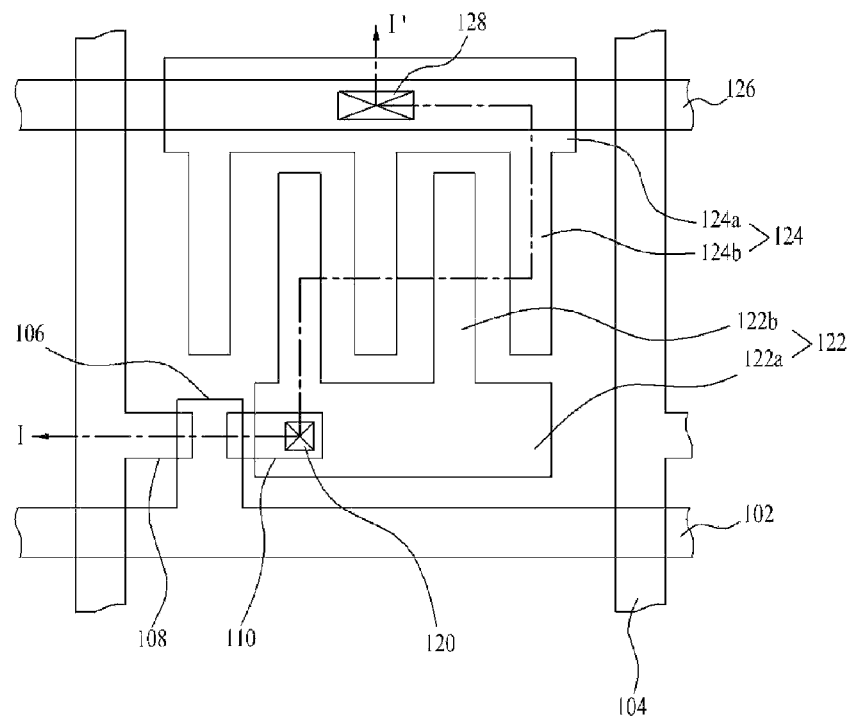
FIGS. 8A and 8B illustrate a plan view and a sectional view showing an exemplary method for forming the transparent conductive pattern shown in FIGS. 2 and 3.
Figure 8B:
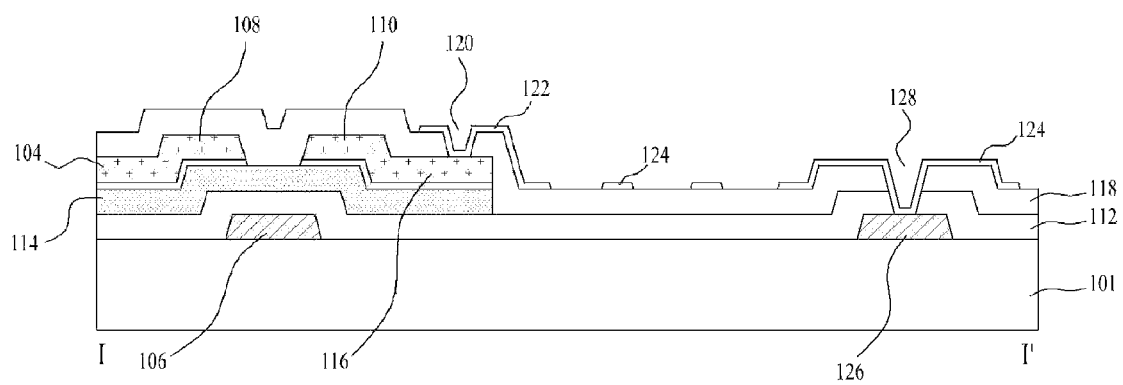

FIGS. 8A and 8B illustrate a plan view and a sectional view showing a method for forming the transparent conductive pattern shown in the method for forming a thin film transistor substrate in accordance with an exemplary embodiment of the present disclosure.

A transparent conductive pattern, having a pixel electrode 122 and a common electrode 124, may be formed on the lower substrate 101 having the protective film 118 formed thereon.

In detail, a transparent conductive film may be formed on the lower substrate 101 having the protective film 118 formed thereon by deposition such as sputtering. The transparent conductive film is formed of indium tin oxide ITO, tin oxide TO, indium zinc oxide IZO, $SnO_2$, or amorphous-indium tin oxide a-ITO. Then, the transparent conductive film may be patterned by photolithography and etching to form the transparent conductive pattern having the pixel electrode 122 and the common electrode 124.

In the meantime, though the present disclosure has been described taking a case in which the thin film pattern of the present disclosure is applied to a thin film transistor substrate as an example, besides this, the present is also applicable to a flat display device, such as a color filter substrate of a liquid crystal display device, organic electro luminescence display device, three dimensional image display device, and electro-ink type display device.

As has been described, the method for forming a thin film pattern and a flat display device having the same of the present disclosure has the following advantages.

The present disclosure enables to form a micron pattern with a size below 1 μm by using three thin film layers having an uppermost layer of a non-transparent material. The micron pattern is applicable to a pattern which requires a high resolution. And, if full surface exposure is conducted by using the uppermost layer of a non-transparent material in the three thin film layers, the second photoresist pattern is formed on the substrate in self-alignment without a separate alignment step.

It will be apparent to those skilled in the art that modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A method for forming a thin film pattern, comprising the steps of:
   forming first, second, and third thin film layers on a substrate in succession;
   forming a first photoresist pattern on the third thin film layer;
   patterning the second and the third thin film layers by using the first photoresist pattern as a mask to form a first and a second thin film mask patterns having line widths different from each other;
   forming a second photoresist pattern at a region positioned between the first thin film layer and the second thin film mask pattern where the first and the second thin film mask patterns do not overlap with each other;
   removing the first and the second thin film mask patterns; and
   patterning the first thin film layer by using the second photoresist pattern as a mask to form a thin film pattern,
   wherein the step of forming a second photoresist pattern includes the steps of:
      forming a second photoresist on the substrate having the first and the second thin film mask patterns formed thereon to cover a side of the first thin film mask pattern and the first thin film layer, and
      exposing and developing a full surface of the first photoresist pattern and the second photoresist to remove the first photoresist pattern and patterning the second photoresist by using the second mask pattern as a mask.

2. The method as claimed in claim 1, wherein the second thin film layer is formed of an inorganic insulating film or a columnar crystal group material, and the third thin film layer is formed of a non-transparent material which shields a light.

3. The method as claimed in claim 2, wherein the columnar crystal group material is molybdenum.

4. The method as claimed in claim 1, wherein the first thin film mask pattern has an obtuse or rectangular taper angle.

* * * * *